United States Patent [19]

Baumgartner

[11] 4,414,678

[45] Nov. 8, 1983

[54] ELECTRONIC UP-DOWN CONTING SYSTEM WITH DIRECTIONAL DISCRIMINATOR

[75] Inventor: Alfons Baumgartner, Grassau, Fed. Rep. of Germany

[73] Assignee: Dr. Johannes Heidenhain GmbH, Traunreut, Fed. Rep. of Germany

[21] Appl. No.: 179,433

[22] Filed: Aug. 19, 1980

Related U.S. Application Data

[63] Continuation of Ser. No. 735,105, Oct. 22, 1976, abandoned.

[30] Foreign Application Priority Data

Oct. 25, 1975 [DE] Fed. Rep. of Germany ....... 2547885

[51] Int. Cl.³ .......................... H04B 3/04; H03K 9/06
[52] U.S. Cl. ........................................ 377/28; 377/45;
  328/133; 340/825.17
[58] Field of Search ..................... 328/46, 48, 133, 44;
  307/221; 340/173 R; 235/92 CC, 92 EV;
  365/94-98; 377/3, 28, 45

[56] References Cited

U.S. PATENT DOCUMENTS

| | | |
|---|---|---|
| 3,206,683 | 9/1965 | Davis et al. |
| 3,500,022 | 3/1970 | Toscano. |
| 3,517,322 | 1/1970 | Lay ...................... 328/133 |
| 3,551,808 | 12/1970 | Grossimon et al. ................ 328/133 |
| 3,638,186 | 1/1972 | Schwefel .......................... 235/92 R |
| 3,729,621 | 4/1973 | Taisne ............................. 235/92 R |
| 3,798,557 | 3/1974 | Scott et al. ......................... 328/133 |
| 3,864,551 | 2/1975 | Oefinger ......................... 235/92 PC |
| 3,911,399 | 10/1975 | Maecker .............................. 328/133 |
| 3,934,233 | 1/1976 | Fisherel ......................... 340/173 R |
| 4,031,630 | 6/1977 | Fowler ................................. 73/1 E |

FOREIGN PATENT DOCUMENTS 2062706 12/1970 Fed. Rep. of Germany.
1351312 4/1974 France.

OTHER PUBLICATIONS

PLAs Enhance Digital Processor Speed and Cut Component Count. Electronics 8/8/74.
IBM Technical Disclosure Bulletin, vol. 16, No. 3, Aug. 1973, pp. 1003–1004.
Bipolare Festwerspeicher from Spezial-Electronic KG. Bipolare Halbleiterspeicher, Neumuller GmbH, Apr. 1973.
Microcomputer/Microprocessors: Hardware, Software and Applications, by J. Hilburn et al., Prentice Hall, TK7888.3, #48, N.J., 1976, pp. 79–86.
TTL Data Book Supplement to CC–401, Texas Instruments, pp. 426–429, 1973.
"Large and Medium Scale Intogration: Devices and Applications", S. Weber McGraw–Hill, 1974, pp. 140–144, Oct. 1974.
Intersil Data Sheet for Read Only Memory, IM 5600, IM 5610, Dated 9/71.

*Primary Examiner*—Stanley D. Miller
*Assistant Examiner*—B. P. Davis
*Attorney, Agent, or Firm*—Willian, Brinks, Olds, Hofer, Gilson & Lione, Ltd.

[57] ABSTRACT

An electronic up-down counter system including a directional discriminator for accepting input pulses and for generating sequences of pulses which represent up-count and down-count signals. The count signals are applied to a reversible up-down counter having separate inputs for up-count pulses and down-count pulses. The directional discriminator is embodied in a read-only memory (ROM), which accepts the source input pulses to be counted and several inputs having predetermined phase relationships with the source pulse train. The ROM determines from the phase relation whether the count is up or down and generates the appropriate output pulse sequence for application to the reversible up-down counter. The ROM may be logically adapted to be sensitive to a change in sign when the up-down counter passes through a "zero" count.

17 Claims, 3 Drawing Figures

ELECTRONIC UP-DOWN CONTING SYSTEM WITH DIRECTIONAL DISCRIMINATOR

This application is a continuation of application Ser. No. 735,105, filed 10/22/76 now abandoned.

BACKGROUND OF THE INVENTION

The invention relates to an electronic up-down counting system. Such counting systems are used in the measuring, control and regulation techniques to process inputs in the form of pulses and/or pulse sequences, each of which may represent, for example, a defined incremental linear or angular displacement of a moving object. It is already known in the prior art to utilize for control of such counting circuits two pulse sequences which are phase shifted in relation to each other and which are applied to a directional discriminator circuit. Usually, a so-called sign signal is also provided to the directional discriminator and the counting circuit. This sign signal is used to indicate the sign and to change the counting direction. From the two phase-shifted input signals the directional discriminator determines the counting direction. Prior art directional discriminators include differentiators or monostable multivibrators, bistable multivibrators and associated logic elements. The particular direction of counting in such prior art discriminators is determined by the application of the input pulse sequence to be counted and a pulse sequence phase shifted in time with respect to the input pulse sequence to be counted. The sign processing circuitry is known counting systems usually includes a bistable multivibrator and logical connecting members. Thus, the electronic up-down counting systems in the prior art require a large number of electronic building components. This results in considerable expense for circuits, equipment and space, as well as complexity. Besides integrated circuits, the aforementioned differentiators and monostable multivibrators also require discrete building components (e.g., capacitors and resistors). In case of electronic counters including circuits or changing the counting direction, for generating error signals, for setting and resetting the counter, for providing for start-stop operation, for performing multiplication and by which the signals generated by the input pulse generator are evaluated singly, doubly or quadruply, the circuitry expenses and complexity are increased considerably.

It is, therefore, an object of the present invention to provide a simple and inexpensive up-down counting system.

It is a further object of the present invention to provide an up-down counting system having an improved input pulse directional discriminator.

Still another object of the present invention is to provide a simple and inexpensive input pulse directional discriminator for use with a known up-down counter.

A further object of the subject invention is to provide an improved pulse directional discriminator having a sign-storing circuit which is sensitive to the all-zero state of an up-down counter.

Another object of the present invention is to provide an improved up-down counting system having a sign signal indicating the true count direction.

SUMMARY OF THE INVENTION

The objects and purposes of the invention are accomplished by utilizing state-of-the-art electronic components in novel configurations. The disclosed up-down counting system includes a read-only-memory (ROM) which is adapted to perform as a directional discriminator for applying appropriate up or down count pulses to a reversible up-down counter. The ROM directional discriminator accepts the input pulses to be counted and pulses phase-shifted in time with respect to the input pulses for determining the direction of count. The ROM directional discriminator may also provide individual outputs which are equivalent to the input frequency multiplied by the factors one, two, and four. The ROM directional discriminator may also be adapted to be sensitive to the true count sign for reversing the operation of count pulses to the up-down counter.

BRIEF DESCRIPTION OF THE DRAWING

The various objects, advantages and features of the present invention will become more apparent to one skilled in the art from the detailed description when read in conjunction with the drawing, wherein.

DETAILED DESCRIPTION OF THE INVENTION

In the following description, reference is made to linear and angular displacement measuring systems which provide the input pulses to be counted and evaluated by the counting system of the present invention. It is known, however, that up-down counting systems can be used in other environments; and the particular application disclosed is not a limitation upon the invention.

Figure 1:
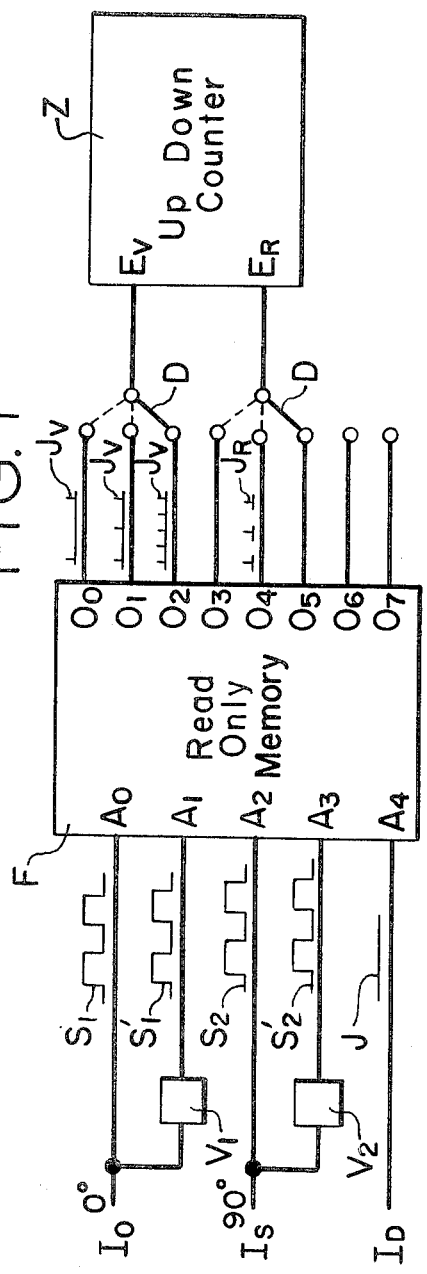
FIG. 1 is a schematic representation of the up-down counting system of the present invention.

FIG. 1 shows an up-down counting system according to the invention which is controlled by two rectangular input pulse signals $S_1$ and $S_2$ which are phase-shifted in time with respect to each other and are generated by a source pulse generator (not shown). The pulses $S_1$ applied at the input line $I_0$ are the pulses to be counted and evaluated by the up-down counting system of the present invention; and the pulses $S_2$ applied to the input line $I_s$ are similar to the pulses $S_1$ but are phase shifted by 90 degrees. A read-only-memory (ROM) F or some similar memory element is used in the up-down counting system as a directional discriminator and takes the place of the complex logic circuitry used in prior art directional discriminators. Read only memories (ROM's) are known electronic building blocks in which information is stored in such a manner that the information is very difficult or even impossible to change once the ROM has been fabricated for use. ROM F used in the disclosed system is adapted such that the required output conditions obtained outputs $O_0$ through $O_7$ are associated with the occuring signal combinations at the address inputs $A_0$ through $A_4$.

The rectangular pulses $S_1$ and $S_2$ which are phase shifted with respect to each other are applied to address inputs $A_0$ and $A_2$ of the ROM F. In addition, time-delayed signals $S_1'$ and $S_2'$ are applied to the address inputs $A_1$ and $A_3$ for the identification of signal level changes. The delay in time for obtaining $S_1'$ and $S_2'$ results from the asynchronous application of a time delay and the synchronous shifting of each of the input signals $S_1$ and $S_2$ by one pulse width via a bistable multivibrator (for example, a flip-flop sliding register). $V_1$ and $V_2$ identify the delay circuits in FIG. 1 for accepting signals corresponding to $S_1$ and $S_2$, respectively and for generating time delayed signals $S_1'$ and $S_2'$ for application to ROM inputs $A_1$ and $A_3$, respectively. ROM F of the disclosed system is also provided with a sign signal input $A_4$ for accepting a logic level through line $I_d$, which sign signal indicates the direction of the count for controlling the outputs which are applied to an up-down counter Z.

Figure 2:
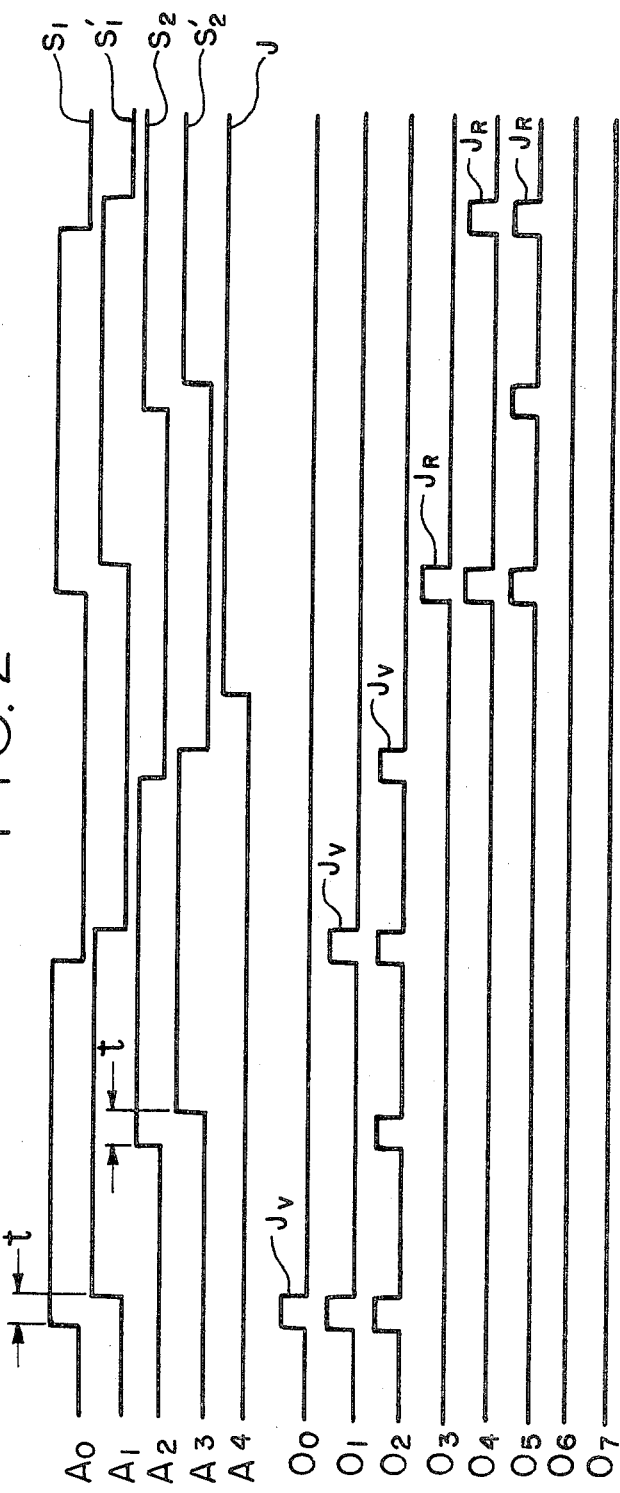
FIG. 2 is a timing diagram of the signals utilized in the present invention.

As shown in FIG. 2, the two rectangulr signals $S_1$ and $S_2$ which are phase-shifted with respect to each other by 90 degrees are applied to the address inputs $A_0$ and $A_2$ ROM F. A reference configuration is chosen such that when the count is in the up direction, which may correspond to the displacement of an object in the positive displacement direction, signal $S_1$ trails signal $S_2$. The ROM F which according to the disclosed system performs the functions of a directional discriminator is so configured that during an up count or positive displacement, "forward impulses" $J_v$ occur at the outputs $O_0$, $O_1$ and $O_2$ of the ROM F. Down count or negative displacement is indicated when signal $S_1$ leads signal $S_2$ and causes "reverse impulses" $J_r$ to occur at the outputs $O_3$, $O_4$ and $O_5$ of the ROM. The impulses $J_v$ are applied to the forward input $E_v$ of the up-down counter Z and impulses $J_r$ are applied to the reverse input $E_r$ of the up-down counter Z. The up-down counter Z causes the counting of the impulses $J_v$ and $J_r$ and generates signals indicative of the total count. The foregoing input/output functions are performed with a logical low signal J applied at the direction signal line $I_d$ which provides a signal for the input $A_4$ of the ROM. The ROM F is configured in such a manner that upon change from a logical low signal to a logical high signal being applied to the count direction signal line $I_d$, the foregoing input/output relationships are reversed. That is, with a logical high signal applied to line $I_d$ reverse impulses $J_r$ are produced with a leading signal $S_2$; while forward impulses $J_v$ are produced with a trailing signal $S_2$ at the respective outputs of the ROM F.

The change in the timing of the input signals $S_1$ and $S_2$ or a change in signal level is recognized by differential logic levels between a direct signals $S_1$ and $S_2$ being applied to the address inputs $A_0$ and $A_2$ and the time delayed signals $S_1'$ and $S_2'$ which are applied to the inputs $A_1$ and $A_3$, respectively. Upon a change in the signals $S_1$ and $S_2$ from logical low to logical high, a logical high signal is applied to the inputs $A_0$ and $A_2'$, respectively, at the time the changes occur; and logical low signals are applied to the inputs $A_1$ and $A_3$, respectively, after the appropriate time delays. Upon completion of the predetermined time delays caused by the delay circuits $V_1$ and $V_2$, the signals $S_1$, $S_1'$ $S_2$ and $S_2'$ again will have identical logical levels which for the foregoing low to high change make all of these signals achieve a logical high level. An erroneous input condition of the signals $S_1$, $S_1'$, $S_2$ and $S_2'$ would exist if the delay times overlap. This could be caused by a phase shift between the signals $S_1$ and $S_2$ which is too small or by a time delay which is too long in duration. However, the ROM of the disclosed counting system may also be used to control errors. The system of FIG. 1 may be so configured that with erroneous input conditions of the signals $S_1$, $S_1'$ $S_2$ and $S_2'$, an error signal is generated at the output $O_7$ of the ROM which may be used to activate a warning system.

Another feature of the disclosed counting system is the use of the ROM F for providing output impulses which are equivalent to the count impulse output of the rectangular signals $S_1$ and $S_2$ multiplied by the factors 1, 2 and 4. That is, ROM F generates at its forward count outputs $O_0$, $O_1$, $O_2$ and its reverse count outputs $O_3$, $O_4$, $O_5$ impulse sequences which represent the actual count, twice the actual count, or four times the actual count. For example, in FIG. 1, at output $O_2$ a quadruple evaluation impulse sequence is generated, which represents four times the actual count and which in essence is a count of all the signal level changes of the rectangular signals $S_1$ and $S_2$.

If a particular application should so require it, the ROM F may be adapted in such manner that it causes control of the various counting system functions, such as setting of the counter sign or start-stop operation. The configuration of the ROM which may be used in the disclosed counting system is generally such that the necessary output conditions which are determined by corresponding memory location values are associated with occurring signal combinations at the address inputs which are shown as $A_0$ through $A_4$ in FIG. 1. Error detection may be built into a ROM by placing error generating values in those memory locations which correspond to non-valid input combinations which may be received by address inputs such as $A_0$ through $A_4$ in FIG. 1.

Figure 3:
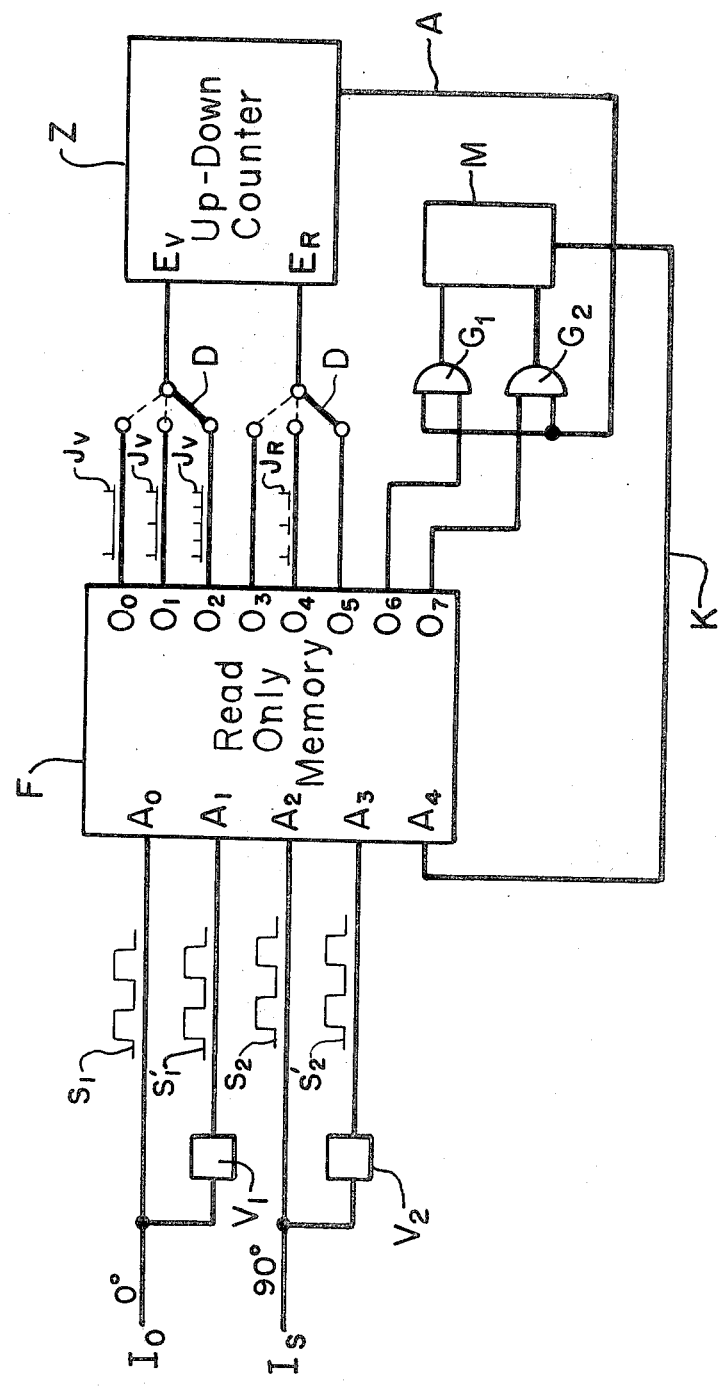
FIG. 3 is count sign sensitive embodiment of the up-down counts of the subject invention.

FIG. 3 shows a refinement of the disclosed counting system wherein the ROM F is not only a directional discriminator but also includes a sign storing circuit as is customary with such counters. Such a circuit allows the disclosed counting system to perform counting operations which are true to the sign. The sign storing circuit includes a bistable multivibrator M and two AND gates $G_1$ and $G_2$ which provide inputs for a bistable multivibrator M. The output A from the up-down counter Z is applied to the inputs of the AND gates $G_1$ and $G_2$. A change of the signal level at the output A occurs only when all decades of the up-down counter Z pass through zero. In the embodiment of FIG. 3, the outputs $O_6$ and $O_7$ of the ROM F is applied to the second input of the AND gate $G_1$ and $G_2$. In this particular embodiment, the ROM F is adapted to also generate up or forward count impulses at the output $O_6$ and down or reverse count impulses at the output $O_7$, which outputs are functions only of the direction of the count or in an incremental displacement measuring system, are functions only of the direction of motion of the object being measured. The output K of the bistable multivibrator M, which is indicative of the sign of the count, is applied to the sign signal input $A_4$ of the ROM F.

It will be appreciated that while only specific embodiments of the present invention and methods of practicing the same have been described and illustrated, changes and modifications therein will be apparent to one skilled in the art, which changes and modifications will nevertheless be within the spirit and scope of the invention as defined by the following claims.

What is claimed is:

1. An electronic up-down counting apparatus arranged to respond to a pulse input representative of measurement information, the pulse input being in the form of two first pulse trains which have substantially identical repetition rates but are phase shifted relative to one another so as to indicate a direction of counting to be effected, said counting apparatus comprising:

means, responsive to the two first pulse trains, for generating two second pulse trains, each of which corresponds to but is out of phase to a slight degree with a respective one of the two first pulse trains, said generating means effective to create a respective selected phase shift between each of the second pulse trains and the respective corresponding first pulse train, which selected phase shifts are less than the phase shift between the two first pulse trains;

a programmed, fixed storage memory device having at least four address input terminals, each of which is connected to a respective one of the first and second pulse trains, and a plurality of output terminals, said memory device programmed to produce output pulse signals on the output terminals in response to the first and second pulse trains, which output pulse signals are representative of the pulse input and the direction of counting; and an up-down counter coupled to the output terminals of the memory device to receive and count, in a direction determined by said memory device, a train of output pulses included in the output pulse signals.

2. The invention of claim 1 wherein the means for generating two second pulse trains comprises two bistable multivibrators, so arranged that each is responsive to a respective one of the two first pulse trains.

3. The invention of claim 1 wherein the memory device comprises a read only memory.

4. The invention of claim 1 wherein the memory device and the counter are coupled to a sign storing circuit.

5. The invention of claim 1 wherein the memory device is programmed to generate an error signal whenever an erroneous combination of signals occurs at the at least four address input terminals of the memory device.

6. The invention of claim 1 wherein the memory device is programmed such that the output pulse signals include a plurality of trains of output pulses, the repetition rates of the respective trains of output pulses being different multiples of the repetition rate of the first pulse trains, and further, wherein the counter is selectively coupled to the memory device so as to receive selected ones of the trains of output pulses.

7. The invention of claim 1 wherein the output pulse signals generated by the memory device have pulse widths corresponding to the selected phase angles.

8. The invention of claim 1 wherein the second pulse trains correspond in both pulse width and repetition rate to the corresponding respective first pulse trains.

9. The invention of claim 8 wherein the phase shift between the two first pulse trains is 90° and wherein the two first pulse trains each have a pulse width equal to a phase angle of 180°.

10. An electronic up-down counting apparatus arranged to respond to a pulse input representative of measurement information, the pulse input being in the form of two first pulse trains which have substantially identical repetition rates but are phase shifted relative to one another so as to indicate a direction of counting to be effected, said counting apparatus comprising:

a pair of time delay circuit means, each of which is responsive to a respective one of the two first pulse trains and is operative to generate a respective second pulse train which corresponds but is slightly phase shifted with respect to the respective one of the two first pulse trains;

a read only memory having at least four address input terminals, each of which is connected to a respective one of the first and second pulse trains, and at least first and second output terminals, said read only memory programmed to produce output signals on the output terminals in response to the first and second pulse trains, which output signals are representative of the pulse input and the direction of counting, said output signals including a plurality of first output pulses on the first output terminal indicative of movement in a first direction of counting and a plurality of second output pulses on the second output terminal indicative of movement in a second direction of counting, opposed to the first direction of counting; and up-down counting means for maintaining a count, incrementing the count in response to the first output pulses, and decrementing the count in response to the second output pulses, said counting means including an incrementing terminal connected to the first output terminal of the read only memory and a decrementing terminal connected to the second output terminal of the read only memory.

11. The invention of claim 1 wherein the means for generating the two second pulse trains is operative to create a selected phase shift of no greater than about 15° between each of the second pulse trains and the respective corresponding first pulse train.

12. The invention of claim 10 wherein the pair of time delay circuit means are operative to create a selected phase shift of less than 180° between each of the second pulse trains and the respective corresponding first pulse train.

13. The invention of claim 10 wherein the pair of time delay circuit means are operative to create a selected phase shift between each of the second pulse trains and the respective corresponding first pulse train, which selected phase shift is less than the phase shift between the two first pulse trains.

14. The invention of claim 10 wherein the pair of time delay circuit means are operative to create a selected phase shift of no greater than about 15° between each of the second pulse trains and the respective corresponding first pulse train.

15. The invention of claim 10 wherein the time delay circuit means provides a delay equal to a selected time interval between each second pulse train and the corresponding respective first pulse train, and wherein the duration of the output pulses is equal to the selected time interval.

16. The invention of claim 10 wherein the second pulse trains correspond in both pulse width and repetition rate to the corresponding respective first pulse trains.

17. The invention of claim 16 wherein the phase shift between the two first pulse trains is 90° and wherein the two first pulse trains each have a pulse width equal to a phase angle of 180°.

* * * * *